United States Patent [19]

Burns et al.

[11] Patent Number: 4,686,127

[45] Date of Patent: Aug. 11, 1987

[54] PELLICULAR LAMINATE MEANS FOR SHIELDING STRUCTURES FROM ELECTROMAGNETIC RADIATION

[75] Inventors: Richard L. Burns, Rancho Santa Fe; Robert J. Petcavich, San Diego, both of Calif.

[73] Assignee: Brunswick Corporation, Skokie, Ill.

[21] Appl. No.: 695,564

[22] Filed: Mar. 15, 1985

Related U.S. Application Data

[62] Division of Ser. No. 609,474, May 11, 1984.

[51] Int. Cl.⁴ .............................................. A61F 13/02
[52] U.S. Cl. ........................................ 428/40; 428/31; 428/285; 428/344; 428/349; 428/352; 428/402; 428/424.2; 428/334; 427/250; 174/35 MS
[58] Field of Search ............... 428/40, 31, 285, 344, 428/349, 352, 402, 424.2, 334; 174/35 MS; 427/250

[56] References Cited

U.S. PATENT DOCUMENTS

| | | | |
|---|---|---|---|
| 4,100,317 | 7/1978 | Narui et al. | 428/137 |
| 4,101,698 | 7/1978 | Dunning et al. | 428/31 |
| 4,215,168 | 7/1980 | Yonemura et al. | 428/215 |
| 4,407,871 | 10/1983 | Eisfeller | 428/31 |

Primary Examiner—Edith Buffalow
Attorney, Agent, or Firm—Bruno J. Verbeck

[57] ABSTRACT

A pellicular laminate comprising: a web of polypropylene film, on at least one surface of which is a layer of polyurethane; a metal, preferably a ductile metal such as gold, which has been deposited on that surface of the polyurethane layer farthest away from said web, by sputtering; a layer of adhesive on the exposed metal surface; and a release liner in the form of a film of polyester or the like covering, but separable from, said adhesive layer. With the web and the release liner removed, the remaining pellicular laminate is useful in shielding structures from electromagnetic radiation by applying the laminate to the surface of the structure to be shielded with the adhesive side towards the structure.

11 Claims, 5 Drawing Figures

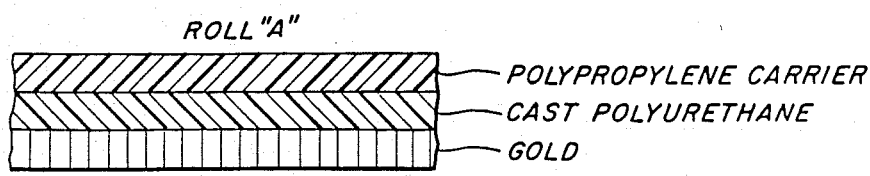

FIG. 1 ROLL "A"
- POLYPROPYLENE CARRIER
- CAST POLYURETHANE
- GOLD

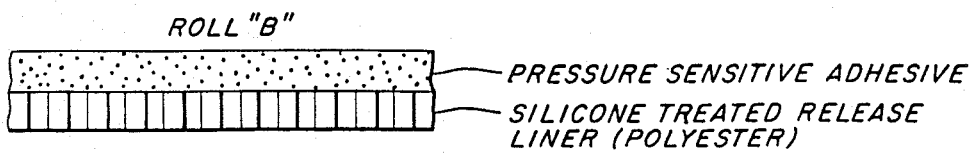

FIG. 2 ROLL "B"
- PRESSURE SENSITIVE ADHESIVE
- SILICONE TREATED RELEASE LINER (POLYESTER)

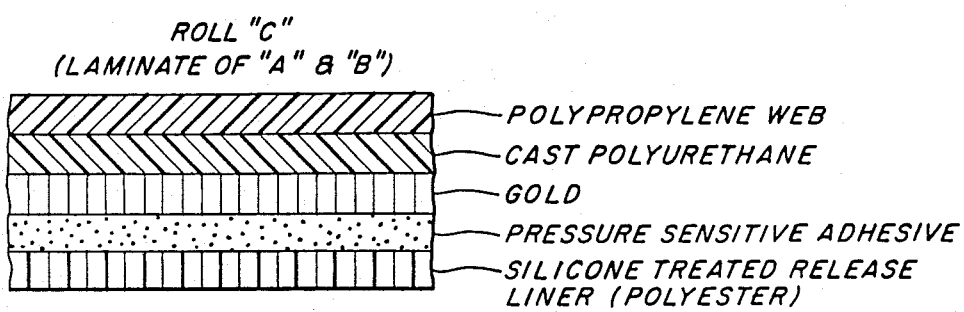

FIG. 4 ROLL "C" (LAMINATE OF "A" & "B")
- POLYPROPYLENE WEB
- CAST POLYURETHANE
- GOLD
- PRESSURE SENSITIVE ADHESIVE
- SILICONE TREATED RELEASE LINER (POLYESTER)

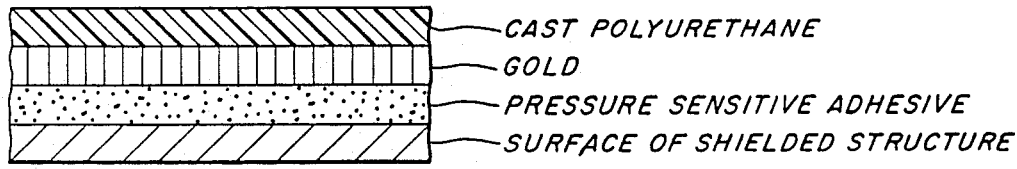

FIG. 5
- CAST POLYURETHANE
- GOLD
- PRESSURE SENSITIVE ADHESIVE
- SURFACE OF SHIELDED STRUCTURE

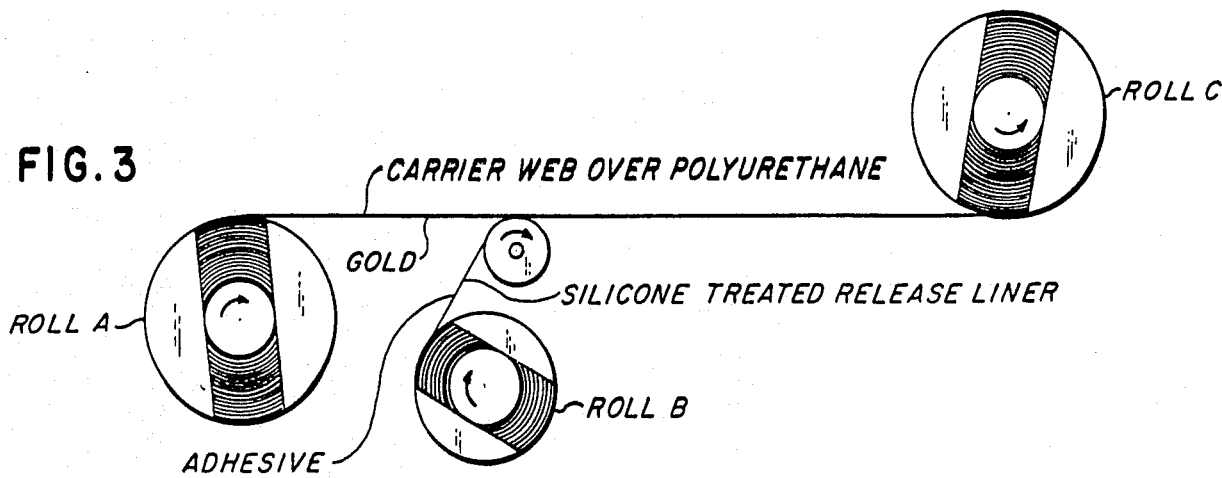

FIG. 3

PELLICULAR LAMINATE MEANS FOR SHIELDING STRUCTURES FROM ELECTROMAGNETIC RADIATION

This is a division, of application Ser. No. 609,474, filed May 11, 1984.

BACKGROUND OF THE INVENTION

The shielding of structures, such as aircraft, instrumentation and components thereof, enclosed in a housing, and the like, from electromagnetic radiation emanating from within or from outside the structure is a desideratum for such purposes as preventing detection of the aircraft or instruments enclosed in the housing, by means which depend on detection of electromagnetic radiation, and for protecting the aircraft and instrumentation within the aircraft from malfunctioning as a result of such electromagnetic radiation. Because of the ineveitable presence of cracks, fissures, seams, and other openings on the surface of aircraft and/or housings, and the like, containing instrumentation, effective and practical shielding of electromagnetic radiation of such has been difficult to achieve. While one solution to the problem would appear to be to apply a protective layer or skin of some kind, containing a barrier to electromagnetic radiation, over the structure to cover such cracks, fissures, seams, and openings, no completely satisfactory means has yet been effected for accomplishing this goal. Thus, a part but only a part, of the problem is that any coating applied to, for example, an aircraft, has to effectively resist abrasion and other destructive forces placed on the skin of the aircraft as it moves through the atmosphere. Furthermore, expansion and contraction of the airplane skin causes separation of coating from the aircraft skin. Such is further aggravated by temperature changes. In short, there is a real need for an effective practical means for achieving adequate electromagnetic shielding which remains effective during varying conditions of weather, abrasive forces, temperature gradients over various parts of the structure resulting in associated variable expansion and contraction of surfaces such as the skin of an aircraft or instrument housings.

SUMMARY OF THE INVENTION

We have now discovered an effective and practical means for shielding structures as for example, aircraft, from electromagnetic radiation, by applying to the surface or surfaces of the structure, a unique pellicular laminate. Our novel laminate when applied to a structure in accordance with our invention effects adequate shielding of the entire structure, and contents thereof, from electromagnetic radiation which would otherwise move into or out of the structure. Our novel pellicular laminate can be readily prepared, stored, transported, and quickly applied to the structure which is to be shielded without requiring complicated or expensive application equipment. Our invention will be more readily understood in light of the following detailed description together with the accompanying drawings.

BRIEF DESCRIPTION OF THE DRAWINGS

FIG. 1 is a view in cross section illustrating the layers making up a laminate, which is rolled up into roll "A" for subsequent lamination to roll "B".

FIG. 2 is a view in cross section showing layers making up another laminate, which is rolled up into roll "B" for subsequent lamination to roll "A".

FIG. 3 is a view of rolls "A" and "B" and the method by which the laminates on these two rolls are pressed together to form the pellicular laminate shown in FIG. 4.

FIG. 5 is a view in cross section, of the applicants' novel pellicular laminate after it has been applied to a surface of an object which is to be shielded against electromagnetic radiation.

The laminates shown in FIGS. 1, 2 and 4 are laminates which are prepared for use in forming the final, or ultimate, pellicular laminate that is illustrated in FIG. 5. This latter is the pellicular laminate which is adhesively secured to the surface of the structure being shielded.

DESCRIPTION OF THE INVENTION

In producing our novel pellicular laminate, a coating, or film, of polyurethane is first applied, as by casting, onto a carrier web in accordance with procedures well known in the art. Besides casting, which is preferred, the coating or film of polyurethane can be applied onto the carrier web by spraying, doctoring, brushing, or the like, of a solution of polyurethane in a suitable solvent. One commercial form of such polyurethane is that having the tradename of ESTANE 5707, manufactured by the B. F. Goodrich Company of 6100 Oak Tree Boulevard, Columbus, Ohio. It is preferably cast onto the carrier web in the form of a solution of the polyurethane resin in tetrahydrofuran, at a suitable concentration, and amount, so that on evaporation of the solvent the film thickness of the resulting polyurethane film will be, preferably, from about 0.5 to about 1.5 mils. The carrier web can be of any suitable thickness, but we have found that a 4-5 mil. thickness of polyethylene, polypropylene, or Teflon film is quite adequate. Preferably the carrier is a polypropylene film such as Treafilm, available from TREA Industries of North Kings Town, Rhode Island. The resulting composite, or laminate which can be conveniently 60 inches wide and in the form of a roll containing 3000 feet of product, is then run through a vacuum metallizing sputter coater, and a deposit of metal, preferably a ductile metal, such as pure gold, 100 to 1000 Angstroms thick, is placed on the polyurethane surface. It is highly desirable that the deposition of gold take place at a relative low temperature, for example, less than about 150° F. for best results. The technique and procedure of effecting such sputter deposition is otherwise well known, and described, for example, in U.S. Pat. Nos. 4,322,276 and 4,426,275. We wish to point out that a characterizing feature of sputtering processes is that almost any metal can be deposited on the target, such as a film, regrdless of the melting point of the metal or the complexity of the alloy or mixture being applied.

After passing through the sputter coater, this laminate is wound up onto a roll, shown as roll "A" in FIG. 3.

A second laminate is prepared by casting a layer of adhesive, from about 0.0001 to 0.001 mils. in thickness, onto a silicone-treated polyester film, suitably 1 to 2 mils. thick, also referred to hereinafter as a release liner. A suitable adhesive is the pressure-sensitive, self-curing, film-forming acrylic solution, sold under the tradename of DURO-TAK 80-1057, by the National Starch and Chemical Corporation of Bridgewater, N.J. A typical silicone coated polyester film which can be used is a product from Custom Coating and Laminating, Inc., 717 Plantation Street, Worester, Massachusetts. This laminate is shown in the drawings as roll "B".

The aforesaid two laminates are then run through a laminator of conventional design, and a third laminate is formed, as shown in FIG. 3, and rolled up to form a roll "C".

In a preferred form, the laminate on roll "C" will be composed of the following layers:

4–5 mil polypropylene carrier web;
0.25 to 1.5 mil. cast polyurethane;
100 to 1 K Angstroms of sputtered metal;
A 0.0001 to 0.001 mil thick layer of adhesive;
A 1 to 2 mil. silicone treated release liner (polyester).

In use the silicone-treated release liner is peeled away from the remainder of the composite, and the adhesive side of the remaining composite is applied to the structure which is to be shielded. After application the polypropylene web is removed, leaving a three-layer composite of cast polyurethane, gold, and pressure-sensitive adhesive. It is to be understood of course that the composite applied to the structure to be shielded can be in any desired width or length, and will depend on the size and configuration of the structure being covered.

Besides the radiation-shielding characteristics of our pellicular laminate, a further feature stems from the fact that as the surface of the structure which has been coated contracts and expands as a result of mechanical, aerodynamic, and temperature variations, our novel laminate contracts and expands accordingly. It can be stretched substantially, to as much as 20 percent, at which point, although the resistivity goes up, the material remains conductive, while on release it goes back to its original value, functioning almost like a variable resistor.

Besides all of the above, an additional important feature of our invention is that the pellicular laminate which has been applied to the structure being shielded from electromagnetic radiation, can be applied in the form of strips or sheets of varying size and configuration, and because of its flexibility can be readily applied to irregular surfaces, i.e., those having protuberances and indentations. Additionally, the strips or sheets, in whole or in part, can be quickly and easily removed from the surface to which they had been attached, and quickly easily replaced, in whole or in part, as desired, by replacement sheets, or strips, of our pellicular laminate.

In the foregoing specification we have described preferred forms of our invention in their application to the shielding of such structures as aircraft and instrument housings, from electromagnetic radiation. However those skilled in the art will appreciate that our invention may be modified in various ways, only some of which may have been specifically mentioned herein and may be applied to different types of structures, all without departing from the spirit and scope of our invention. Therefore it is to be understood that our invention is not limited to the specific forms described herein or in any manner other than by the scope of appended claims when given the range of equivalents to which our invention may be entitled.

What is claimed as the invention is:

1. A pellicular laminate comprising a carrier web of a polyolefin; a continuous coating of polyurethane on a surface of said web; a conductive layer consisting essentially of metal sputter-deposited on the exposed surface of the polyurethane coating; a coating of pressure-sensitive adhesive on said metal surface; and a silicone-coated film covering said adhesive layer.

2. The pellicular laminate of claim 1 wherein said carrier web is formed of polypropylene.

3. The pellicular laminate of claim 1 wherein said carrier web is formed of polyethylene.

4. The pellicular laminate of claim 1 wherein said metal is a ductile metal.

5. The pellicular laminate of claim 1 wherein said metal is gold.

6. The pellicular laminate of claim 1 wherein said film is formed of polyester.

7. The pellicular laminate of claim 1 wherein said polyurethane coating is from about 0.25 to 5 mils. in thickness.

8. The pellicular laminate of claim 1 wherein the said polyurethane is cast on the carrier web.

9. The pellicular lamminate of claim 1 wherein the carrier web is formed of Teflon.

10. The pellicular laminate of claim 1 having a surface resistivity of less than 5 ohms per square.

11. The pellicular laminate of claim 5 wherein the thickness of the gold is from 100 to 1000 Angstroms.

* * * * *